(12) United States Patent
Winkler et al.

(10) Patent No.: US 8,330,130 B2
(45) Date of Patent: Dec. 11, 2012

(54) CHARGED PARTICLE SOURCE WITH AUTOMATED TIP FORMATION

(75) Inventors: Dieter Winkler, Munich (DE); Udo Weigel, Munich (DE); Stefan Grimm, Kirchheim (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 224 days.

(21) Appl. No.: 12/253,042

(22) Filed: Oct. 16, 2008

(65) Prior Publication Data

US 2009/0121160 A1    May 14, 2009

(30) Foreign Application Priority Data

Nov. 13, 2007  (EP) .................................... 07022031

(51) Int. Cl.
 *G01J 1/00* (2006.01)
(52) U.S. Cl. ...................... 250/503.1; 250/287; 250/424
(58) Field of Classification Search ................. 250/503.1
 See application file for complete search history.

(56) References Cited

U.S. PATENT DOCUMENTS

| | | | | |
|---|---|---|---|---|
| 3,868,507 | A * | 2/1975 | Panitz ............................ | 250/287 |
| 4,733,134 | A * | 3/1988 | Tamura et al. ............ | 315/111.81 |
| 6,388,384 | B1 | 5/2002 | Pierrejean | |
| 6,416,374 | B1 * | 7/2002 | Mitome et al. .................... | 445/6 |
| 6,512,335 | B1 | 1/2003 | Dunphy et al. | |
| 7,485,873 | B2 * | 2/2009 | Ward et al. ................. | 250/423 F |
| 2007/0210251 | A1 | | 9/2007 | Ward et al. | |

FOREIGN PATENT DOCUMENTS

| | | |
|---|---|---|
| JP | 63141247 | 6/1988 |
| JP | 07240165 | 9/1995 |
| JP | 07272653 | 10/1995 |
| JP | 2006-260807 | 9/2006 |

OTHER PUBLICATIONS

Extended European Search Report for Application No. 07022031.4-2208; Dated May 5, 2008.
Translation of the reasoning of Official Action dated Nov. 2, 2011 fpr Japanese Patent Application No. 2008-229863.

* cited by examiner

*Primary Examiner* — Phillip A Johnston
(74) *Attorney, Agent, or Firm* — Patterson & Sheridan, LLP

(57) ABSTRACT

A charged particle beam device is described. The device includes an emitter unit including an emitter tip; a voltage supply unit adapted for providing a stable voltage to generate a stable extraction field at the emitter tip; a pulsed voltage supply member adapted for providing a pulsed voltage to generate a pulsed extraction field on top of the stable extraction field; a measuring unit for measuring an emitter characteristic; and a control unit adapted for receiving a signal from the measuring unit and for control of the pulsed voltage supply member.

22 Claims, 6 Drawing Sheets

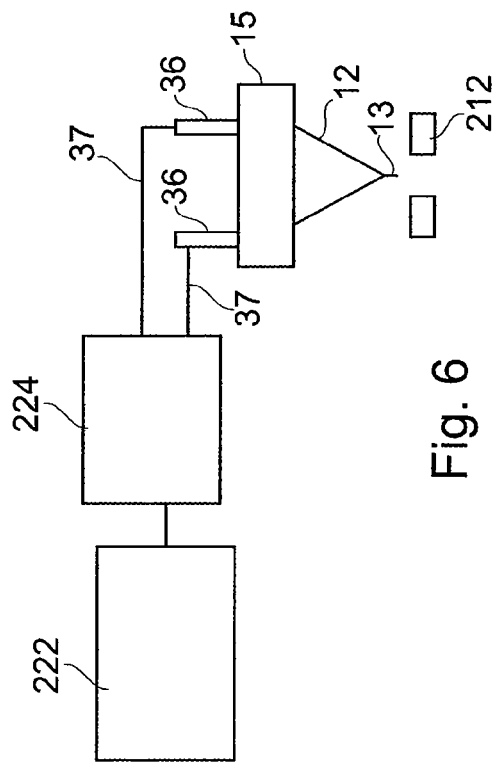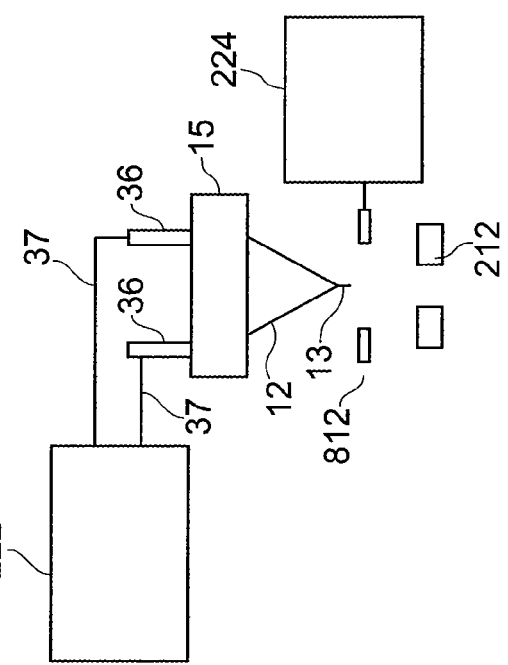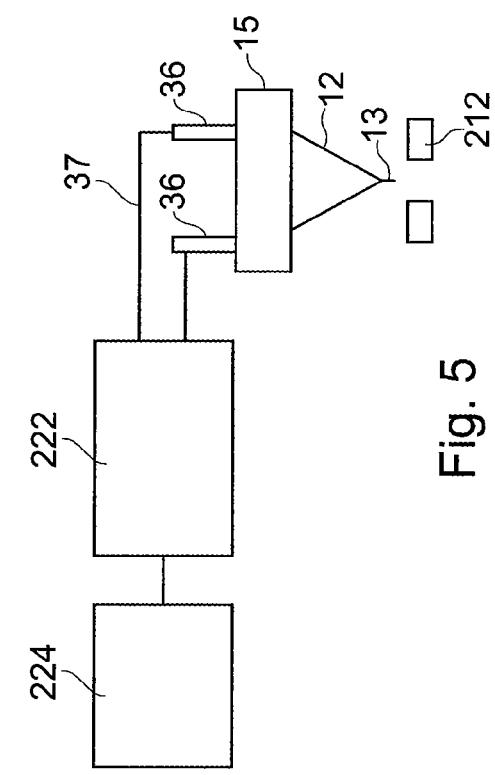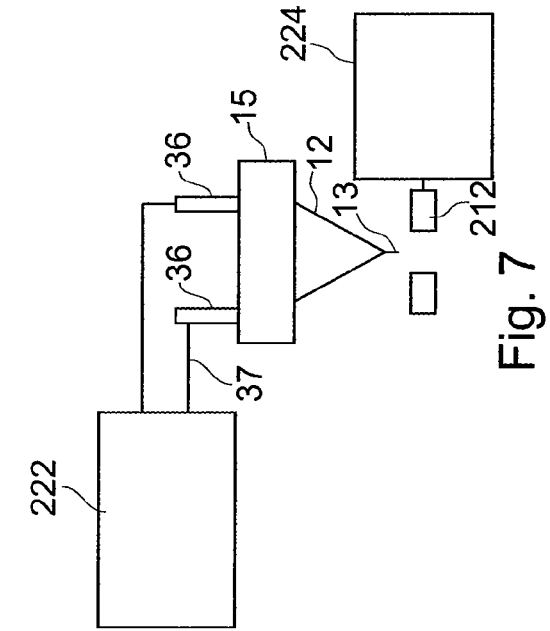

CHARGED PARTICLE SOURCE WITH AUTOMATED TIP FORMATION

FIELD OF THE INVENTION

Embodiments described herein generally relate to a charged particle beam device and a method of operating a charged particle beam device. In particular, embodiments relate to a control unit of a charged particle beam source of the charged particle beam device and control of a charged particle beam source of the charged particle beam device. More particularly, it relates to control of a power supply of a charged particle beam source. Specifically, it relates to a charged particle beam device and method of operating a charged particle beam device.

BACKGROUND OF THE INVENTION

Charged particle beam apparatuses have many functions in a plurality of industrial fields, including, but not limited to, inspection of semiconductor devices during manufacturing, testing systems, imaging systems, detecting devices, and exposure systems for lithography. Thus, there is a high demand for use of charged particle beam devices for structuring and inspecting specimen within the micrometer and nanometer scale.

Examples of charged particle beam devices are electron microscopes, electron beam pattern generators, ion microscopes as well as ion beam pattern generators. Charged particle beams, in particular ion beams, offer superior spatial resolution compared to photon beams, due to their short wavelengths.

Gas field ion sources for particle microscopes and other particle devices promise an increase in resolution over state-of-the-art charged particle sources. Accordingly, gas field ion sources are promising for use in very high-resolution applications. In order to enable very high resolutions, a variety of system requirements have to be considered.

When microscopes based on gas field ion sources or other charged particle sources are to be used in commercial applications, reliable and automated procedures for maintenance are needed. This applies, for example, to cleaning, rebuilding, and/or building of the emitter tip in the charged particle beam device.

SUMMARY OF THE INVENTION

In light of the above, in at least one embodiment the present invention provides a charged particle beam device according to independent claim 1, and a method of operating a charged particle beam device according to independent claim 13.

According to one embodiment, a charged particle beam device is provided. The charged particle beam device includes an emitter unit including an emitter tip, a voltage supply unit adapted for providing a stable voltage to generate a stable extraction field at the emitter tip, a pulsed voltage supply member adapted for providing a pulsed voltage to generate a pulsed extraction field on top of the stable extraction field, a measuring unit for measuring an emitter characteristic; and a control unit adapted for receiving a signal from the measuring unit and for control of the pulsed voltage supply member.

According to another embodiment, a method of operating a charged particle beam device having an emitter unit including an emitter tip is provided. The method of operating a charged particle beam device includes emitting a charged particle beam by providing a static voltage, measuring a characteristic of the charged particle beam for providing measurement result, and providing a voltage pulse in addition to the static voltage, which is dependent on the measurement result.

Further advantages, features, aspects and details that can be combined with the above embodiments are evident from the dependent claims, the description and the drawings.

Embodiments are also directed to apparatuses for carrying out the disclosed methods and include apparatus parts for performing described method steps. These method steps may be performed by way of hardware components, a computer programmed by appropriate software, by any combination of the two or in any other manner. Further, embodiments are also directed to methods by which the described apparatus operates. It includes method steps for carrying out functions of the apparatus. These method steps may be performed by way of hardware components, a computer programmed by appropriate software, by any combination of the two or in any other manner.

BRIEF DESCRIPTION OF THE DRAWINGS

Some of the above indicated and other more detailed embodiments of the invention will be described in the following description and partially illustrated with reference to the figures. Therein:

FIG. 5 shows a schematic view of a charged particle beam source and two voltage sources connected to the charged particle beam source according to embodiments described herein;

FIG. 6 shows a schematic view of a charged particle beam source and two voltage sources connected to the charged particle beam source according to embodiments described herein;

FIG. 7 shows a schematic view of a charged particle beam source and voltage sources connected to an electrode according to embodiments described herein;

FIG. 8 shows a schematic view of a charged particle beam source and voltage sources connected to a further electrode according to embodiments described herein;

DETAILED DESCRIPTION OF THE DRAWINGS

Without limiting the scope of the present application, in the following the charged particle beam device or components thereof will be referred to, by way of example, as an ion beam device or components thereof, which detect secondary and/or backscattered electrons. Thereby, the secondary and/or backscattered electrons might especially be utilized during inspection or lithography. The present invention can still be applied for apparatuses and components using other secondary and/or backscattered charged particles to obtain a specimen image, to control patterning of a specimen, for testing, imaging, inspection applications or during specimen modification applications like sputtering, milling or the like.

Further, embodiments described herein are often described with respect to gas field ion sources. However, it is to be understood that embodiments can also be directed to other charged particle beam sources, like gas ion sources, liquid ion sources, field emitters, e.g., cold field emitter or thermal field emitters, Schottky emitters, or thermal emitters.

Within the following description of the drawings, the same reference numbers refer to the same components. Generally, only the differences with respect to the individual embodiments are described.

Figure 1:
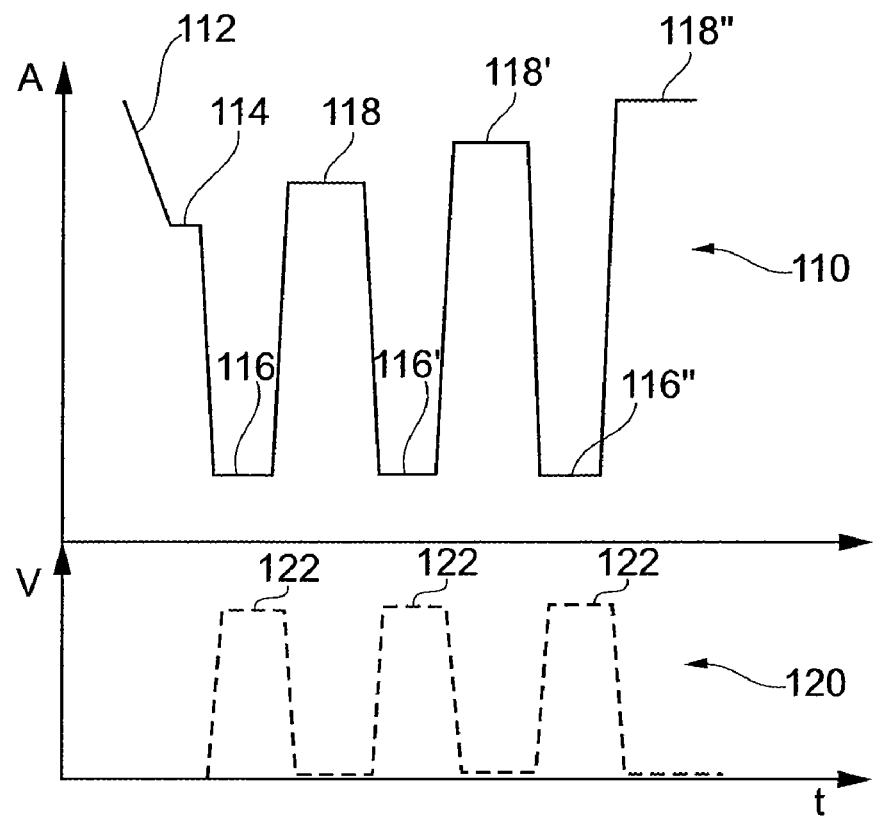
FIG. 1 shows a schematic diagram of a charged particle beam current and a voltage, which is superimposed to a voltage of a voltage source for a gas field ion source according to embodiments described herein.

FIG. 1 illustrates operation of a gas field ion source according to embodiments described herein. The top portion in FIG. 1 shows curve 110 illustrating a beam current of a gas field ion source. During use, the tip of a gas field ion source can degrade which may result in lowering of the emitted charged particle beam current as indicated by portion 112 of the curve 110. Such a degraded tip may stabilize as indicated by portion 114 of curve 110. However, the best operation mode of the emitter can be provided if the emitter tip consists of a few atoms only and if the tip is free of contamination light adsorbates or oxides. Under such conditions the emission of a gas field ion source is confined and a maximum and stable emission current can be achieved.

According to embodiments described herein, voltage pulses 122 can be applied to the voltage source of the gas field ion source as shown in curve 120 of FIG. 1. Thereby, as indicated by portions 118, 118' and 118", the current of the charged particle beam device can recover. Embodiments described herein allow for reconditioning and/or conditioning of the emitter tip. Contrary to commonly used methods for reconditioning, e.g., cleaning or rebuilding, of the emitter tip, embodiments described herein allow for automated in situ processes. According to embodiments described herein, automated tip reprocessing a cleaning procedure can be provided to recover a degraded ideal tip geometry (e.g., a trimer) or a contaminated tip.

According to embodiments described herein, voltage pulses can be generated on top of the applied static high-voltage used for operating a gas field ion source by a combination of voltage sources or a modified voltage source for the gas field ion source. As shown in FIG. 1, if the voltage pulse 122 is applied on top of the applied static voltage for the gas field ion source the charged particle beam current drops to a value indicated in portions 116 of curve 110. Between the voltage pulses 122 the beam current raises again and can recover as shown by portions 118, 118' and 118" of curve 110. According to some embodiments described herein the voltage can be raised from the operation voltage until field evaporation of surface atoms occurs. According to other embodiments, the voltage between the emitter tip and an extraction electrode can be raised such that adsorbed atoms or molecules are evaporated. Thereby, the voltage can be kept below the value for which field evaporation occurs.

According to embodiments described herein, voltage pulses can be applied on top of the static voltage. The static voltage can be selected such that a maximum current at maximum stability is extracted from the tip. When the emitter current becomes lower over time, a voltage pulse can be generated automatically. Thereby, the field is raised above the static voltage value for maximum current. During the pulse duration, adsorbates can be evaporated such that after reduction of the voltage the same current or an increased current is achieved again. According to further embodiments, a similar procedure can be applied if the emission current is reduced because the emitter tip geometry has deteriorated. Thereby, however, a higher amplitude for the pulse voltage is selected to enable field evaporation of bulk atoms.

Figure 2:
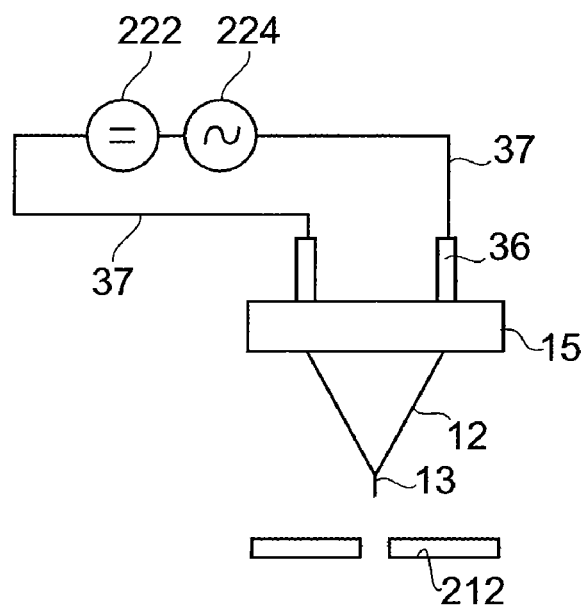
FIG. 2 shows a schematic view of a charged particle beam source and voltage sources according to embodiments described herein.

FIG. 2 illustrates a portion of a charged particle beam device. According to embodiments described herein, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. According to some embodiments described herein, the high-voltage is provided by a constant voltage source 222, which provides a high voltage of high stability. Voltage pulses are added to the stable voltage by voltage source 224.

According to even further embodiments, which can be combined with any of the embodiments described herein, further connections like gas conduit connections and thermal conductivity connections can be provided for the gas field ion source. These and other modifications to yield further embodiments are, for example, disclosed in commonly assigned and co-pending European application No. 06026210.2, filed Dec. 18, 2006, entitled "Gas Field ion source for multiple applications", which is incorporated herein by reference in its entirety for the purpose of describing modification to insert two or more gases for respective apparatuses and/or methods. Even further modifications to yield further embodiments are, for example, disclosed in commonly assigned and co-pending European application No. 07016766.3, filed August 27, entitled "Gas field ion source with high mechanical stability", which is incorporated herein by reference in its entirety for the purpose of describing modification to insert two or more gases for respective apparatuses and/or methods. Accordingly, different embodiments may further include an emitter unit, a cooling unit, and a thermal conductivity unit for thermal conductivity from the cooling unit to the emitter unit, wherein the thermal conductivity unit is adapted for reduced vibration transfer from the cooling unit to the emitter unit.

Yet even further modifications to yield further embodiments are, for example, disclosed in commonly assigned and co-pending European application No. 07013304.6, filed Jul. 6, 2007, entitled "Modular gas ion Source", which is incorporated herein by reference in its entirety for the purpose of describing modification to insert two or more gases for respective apparatuses and/or methods. Accordingly, different embodiments may further include a gas field ion source. The gas field ion source may include an emitter module. The emitter module may include an emitter holder, an emitter structure, a detachably connectable electrical connection assembly of the emitter module, and a detachably connectable gas supply connection assembly of the emitter module. The gas field ion source further includes a supply module, wherein the supply module includes an electrical conductor for providing voltage and/or current, a gas supply conduit, a thermal conductor, a detachably connectable electrical connection assembly of the supply module, and a detachably connectable gas supply connection assembly of the supply module. The emitter module and the supply module are detachably connectable by the detachably connectable connection assemblies of the emitter module and the detachably connectable connection assemblies of the supply module.

Yet even further modifications, to yield further embodiments are, for example, disclosed in commonly assigned an co-pending European Applications No. 05016088.6, filed Jul. 25, 2005, entitled "Continuously cleaning of the emission surface of a cold field emission gun using UV or laser beams", which is incorporated herein by reference in its entirety for the purpose of describing modifications to clean and rebuild emitters tips with additional other processes and/or apparatuses. Accordingly, a charged particle beam device having a field emitter tip having an emitting surface can further include at least one light source adapted to illuminate the emitting surface of the field emitter tip. Thereby, according to further embodiments, it is possible to additionally clean an emitting surface of a field emitter tip by providing a field emitter tip having an emitting surface and a light source and illuminating the emitting surface of the field emitter tip with the light source.

Yet even further modifications, to yield further embodiments are, for example, disclosed in commonly assigned an co-pending European Applications No. 05019259.0, filed Sep. 5, 2005, entitled "Charged particle beam emitting device and method for operating a charged particle beam emitting device", which is incorporated herein by reference in its entirety for the purpose of describing modifications to clean and rebuild emitters tips with additional other processes and/or apparatuses. Accordingly, further modified embodiments may include placing a charged particle beam source in a vacuum of a given pressure, the charged particle beam source exhibiting a high initial emission current $I_0$ and a lower stable mean emission current $I_S$ under given operational conditions, applying the given operational conditions to the charged particle beam source for emitting charged particles from the emitter surface, so that the emission current of the charged particle beam source is higher than the stable mean emission current $I_S$, performing a cleaning process by applying at least one heating pulse to the charged particle beam source for heating the emitter surface to a temperature $T_C$, whereby the cleaning process is performed before the emission current of the charged particle beam source has declined to the lower stable mean emission value $I_S$, and repeating the cleaning process (c) to keep the emission current of the charged particle beam source continuously above the substantially stable emission value $I_S$. As an example, at the beginning of the operation and, particularly, when a new charged particle emitter has been assembled into the charged particle beam emitting device, a master cleaning process can additionally carried out to clean the emitter surface from any persistent contamination. For example for a cold field emitter, the master cleaning process typically employs short and strong heating pulses (master flashing) which heat the emitter surface to a temperature $T_{MC}$ of about 2500 K to 2800 K. Generally, during master cleaning, an extractor voltage applied between charged particle emitter and extraction anode should be turned off so that emission of thermal electrons is kept low. After master cleaning, the charged particle emitter can be brought into normal operation, e.g., by applying an electric extraction field. During normal operation, a charged particle beam is generated and directed onto a specimen to be investigated. Normal operation or the active period of the charged particle beam device, e.g., an SEM or FIB, can than be briefly interrupted to perform a cleaning process. Interruption of the normal mode means that the beam is not focussed onto the specimen. It is therefore possible to maintain the operating conditions of the normal mode and, for example, to deflect the charged particle beam using a beam blanker. Hence, the cleaning process can generally be initiated when the charged particle emitter is working unlike the prior art which performs a cleaning step when the fluctuations of the emission current become intolerable and the operation of the charged particle beam emitting device is therefore terminated. For example for a cold field emitter, heating pulses can be applied during the cleaning process to the charged particle emitter to heat the emitter surface to a maximum temperature of about 2200 K to 2500 K. For cleaning, the maximum temperature should be lower than the temperature at which dulling or thickening of the emitter tip due to high surface tension might be observed. Generally, as an example, a single cleaning process includes 2 to 4 heating pulses having a pulse width of about 1 to 2 sec at 1 to 3 sec intervals. The duration of a single cleaning process should be as short as possible to keep the interruption of the normal mode as small as possible. For instance, a cleaning process should be shorter than 1 minute and particularly less then 10 sec. For example for a cold field emitter, according to even further aspects, to avoid damage of the emitter surface during cleaning, a high suppressor voltage of about 300 V to 1000 V and, preferably, of about 700 V to 1000 V is applied which inhibits unwanted emission from heated portions of the charged particle emitter. The additional optional cleaning process can be repeated as often as required to keep the emitter surface clean. The cleaning process can be initiated at regular intervals or upon request when the emission current drops to a pre-selected minimum value $I_C$ defined as $\alpha I_0$ with $\alpha$ about 0.9 or higher such as 0.95, 0.96, 0.97, 0.98 or, in particular, 0.99. The higher $\alpha$ would be, the higher $I_C$ can be and the more frequently the cleaning process might be performed. The value $\alpha$ should be chosen such that $I_C$ is substantially higher than a stable mean emission current $I_S$ of a particular cold field emitter. Accordingly, additional cleaning procedures can be combined with other embodiments described herein.

According to embodiments described herein, during normal operation, the gas field ion source can be operated by using the static voltage source 222. When the emitter current decreases as shown in portion 112 of curve 110 in FIG. 1, a voltage pulse 122 (see curve 120 of the lower portion of FIG. 1) can be applied by an appropriate control signal to the voltage source 224. During the time the voltage pulse 122 is applied, the beam current is lowered to a value 116 shown in FIG. 1. After the voltage pulse 122, the beam current increases to a value 118. It is possible to measure the emitted current and/or the angular emission distribution between voltage pulses 122. Thereby, it can be evaluated whether or not the beam current 118 has reached the desired beam current of maximum value and a maximum stability. In the example shown in FIG. 1, the beam current at portion 118 of curve 110 has recovered to some degree, but the desired value is not yet obtained. Accordingly, a second voltage pulse 122 can be applied. During the voltage pulse 122 the beam current is lowered to a value 116' of curve 110. After the second voltage pulse 122, the beam current value as indicated by portion 118' is obtained. At that time, it can be measured whether or not the beam current has reached its desired maximum value with maximum stability. Since the beam current value at portion 118' has not yet reached the desired value, another voltage pulse 122 is applied. During the voltage pulse, the beam current is lowered to value 116" as shown in FIG. 1. Within the example shown in FIG. 1, the beam current has reached the desired value 118" after the third voltage pulse. Accordingly, the gas field ion source can be operated under normal conditions without further voltage pulses until a further degrading of the emitter tip 13 of the gas field ion source may occur.

According to embodiments described herein, the emission current can be measured or an image of the emission distribution may be acquired between the pulses, that is in a time period at which no voltage pulse is applied. At that time, the emitter tip shows an emission characteristic corresponding to the characteristic during normal operation. Since an increase in the extraction voltage beyond the value for maximum current, which is for example applied by voltage source 222, leads to a decrease in emission currents as shown by portions 116, 116' and 116", a single voltage pulse of the desired height and duration is difficult to provide in order to fully recondition and clean the emitter tip to the desired value. Providing voltage pulses with an intermediate time for measuring the charged particle beam current and/or the emission distribution, allows an automated process, which can be included in automated maintenance procedures of a charged particle beam device.

Figure 3:
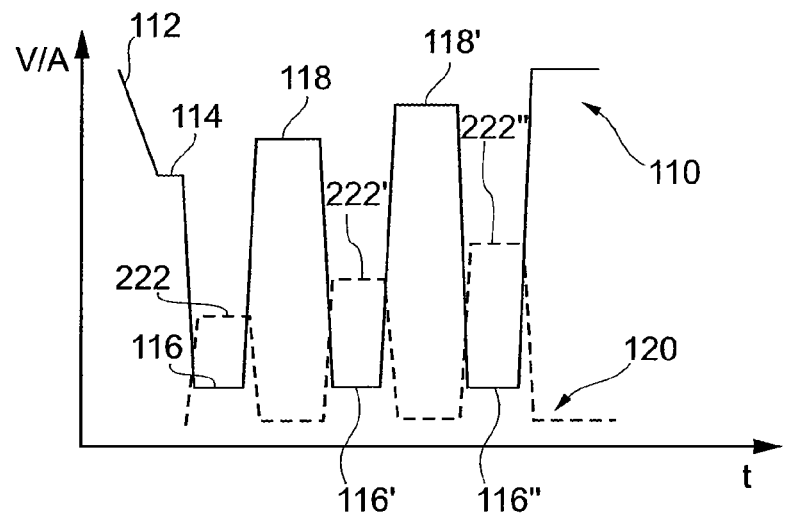
FIG. 3 shows a schematic diagram of a charged particle beam current and varying voltage pulses, which are superimposed to a voltage of a voltage source for a gas field ion source according to embodiments described herein.

According to embodiments described herein, devices and methods are provided, which allow for control of the emission characteristics of the gas field ion source and for applying voltage pulses, which are appropriate for tip conditioning and/or reconditioning corresponding to the measured emission characteristic. According to one embodiment, particularly if the emission currents and/or the angular emission distribution is measured on a regular basis, for example, every 2 min to 1 h or every 5 min to 10 min, one standard voltage pulse can result in the desired recovering of the emitter tip. Thereby it has to be noted that the frequency of control might dependent on the operating conditions of the charged particle beam device. According to other embodiments, one single pulse may not render the desired result. Accordingly, a second pulse or series of pulses can be applied. The time period between the pulses allow for measuring the emission characteristic and thereby, an automated emitter tip processing. According to further embodiments, as for example shown in FIG. 3, within a series of voltage pulses, the amplitude of the voltage pulses can be increased in order to slowly increase the field for removing adsorbates or for rebuilding the emitter. FIG. 3 shows curve 110 for the emitter current and the curve 120 for the voltage pulses. Similarly as described with respect to FIG. 1, a decrease up to a stable value of the beam current is shown in portions 112 and 114 of curve 110. In response to the decrease of beam current, the first pulse 222 can be applied to the emitter tip of the gas field ion source. During the voltage pulse, the beam current decreases to a value indicated by portion 116 of curve 110. Within the series of voltage pulses 122, 122' and 122", the amplitude of the voltage pulses is continuously increased. Thereby, the procedure for cleaning and/or reprocessing of the emitter tip can be accelerated. According to another embodiment, the electric field for removal or rebuilding of the emitter tip of the first pulse 222 can be chosen as small as possible in order to reduce the risk of unwanted major changes in the tip geometry. Starting from a smaller electric field corresponding to a smaller voltage pulse 222, the voltage pulses and, thereby the electric field, can be increased until a desired voltage pulse amplitude is reached. According to even further embodiments, which can be combined with any of the embodiments described herein, a decrease of the voltage pulses can also be used if the beam current value, which is measured between two voltage pulses, almost reached the desired beam current value. According to yet a further embodiment, the amplitude of the voltage pulses can be chosen as a function of the difference between the measured beam current value at a portion 118 or 118' of curve 110 and the desired beam current value.

Figure 4:
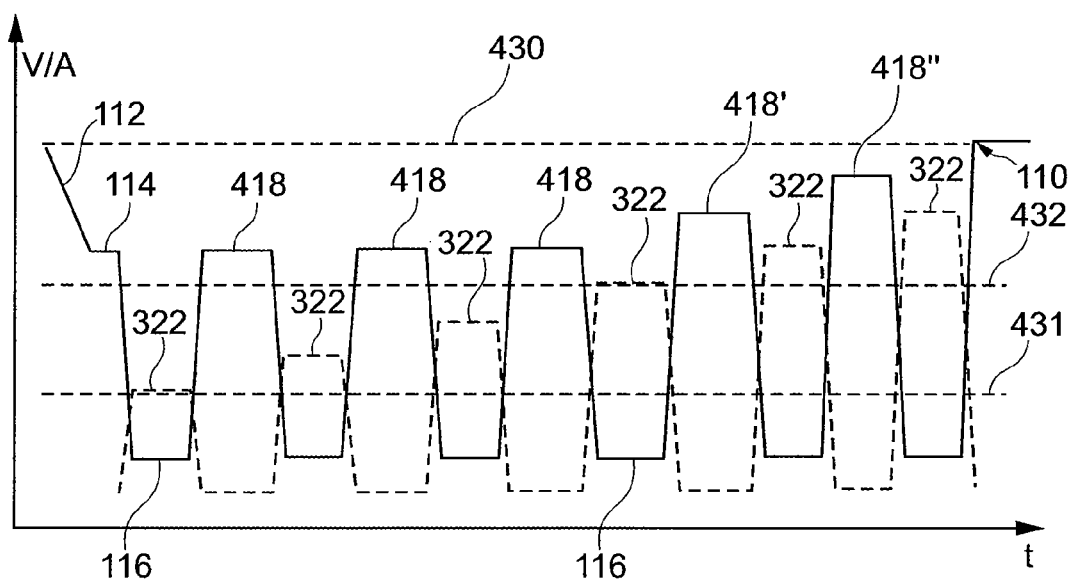
FIG. 4 shows a schematic diagram of a charged particle beam current and further varying voltage pulses, which are superimposed to a voltage of a voltage source for a gas field ion source according to embodiments described herein.

FIG. 4 illustrates further embodiments as described herein. FIG. 4 shows the desired beam current value 430 and voltage pulse amplitude values 431 and 432. The voltage pulse value 431 illustrates a pulse amplitude sufficient to remove adsorbates from the emitter tip. The voltage amplitude 432 indicates a voltage sufficient to provide a field for an evaporation value at which the geometry of the emitter tip can be changed. According to different embodiments, which can be combined with other embodiments described herein, the voltage pulses can be applied by starting with an amplitude sufficient to remove adsorbates. (See, e.g., portion 322 of curve 120 shown in FIG. 4.) Subsequent voltage pulses 322 are increased in amplitude. However, as illustrated in curve 110 for the current shown in FIG. 4, the beam current during these pulses (see portions 418) do not significantly increase. Since the required emission current is not regained by an amplitude sufficient to remove adsorbates it can be assumed that the reduction in beam is due to changes in the tip geometry. Accordingly, as shown in FIG. 4, the voltage pulse amplitudes 322 can be increased to higher values above the voltage value 432. As shown in FIG. 4, rebuilding of the emitter tip and a corresponding increase in the beam current (see portions 418' and 418") can be realized.

FIGS. 1, 3 and 4 referred to an example of a beam current, which may decrease during the supply of the voltage pulses. According to other embodiments, other charged particle beam characteristics can show a different effect during the supply of the voltage pulses. FIGS. 1, 3 and 4 are to be understood as examples of a measurement result of a beam characteristic during voltage pulse supply. As another example, an emission current might increase during supply of the voltage pulses.

According to different embodiments, a plurality of the above described control procedures can be combined. Generally, according to embodiments described herein, two main voltage pulse parameters can be used to optimize the cleaning and rebuilding of the emitter tip. These voltage pulse parameters are the amplitude of the voltage pulses and the duration of the voltage pulses. However, according to yet further embodiments, the rise time, the shape, the frequency or other parameters of the voltage pulses may alternatively or additionally be varied. According to different embodiments, the amplitude might be in the range of 5% to 30% of the static voltage. Other examples are values of 10% or 20% of the static voltage. As an example, if a static voltage of 10 kV is applied, the amplitude of the voltage pulse can be 1 kV. According to other embodiments, which can be combined with these values, pulse durations of 300 ms, 600 ms, 1 second, 2 seconds or up to 10 seconds can be applied. Typical ranges can be, for example, 300 ms to 15 s, 0.5 s to 10 s or 1-3 s.

According to different embodiments, the voltage pulse amplitude and the voltage pulse duration can be combined by any of the control mechanism described above. Thereby, different voltage pulse amplitudes and voltage pulse periods can be applied based on the evaluation if a desired change in beam current or emission characteristic has been obtained with the previous pulse, based on an evaluation of the difference between the measured beam current and the desired beam current, based on a deviation of the measured beam distribution, i.e., an angular emission distribution, and the desired beam distribution, or in another appropriate manner. Thereby, a series of pulses with increasing and/or decreasing voltage pulse amplitudes and voltage pulse durations, or combination thereof, can be applied.

As described above, according to embodiments described herein, the voltage pulses allow for a feedback control of the emitted charged particle beam current, the emission distribution and/or other emission characteristics of the charged particle beam current. The feedback control during periods at which no voltage pulse is applied allow for an automated cleaning and/or rebuilding of the emitter tip. According to further embodiments, the automated cleaning and/or rebuilding of the emitter tip can be provided in situ. Additionally, the processes can increase the life-time of the emitter tip because the feedback and/or pulses decrease the likelihood of emitter tip damage in light of exaggerated tip reconditioning.

According to yet further embodiments, the above-described procedures may also be used for a new emitter tip which has been installed in the charged particle beam device. Thereby, it is possible that voltage pulses are applied until a specific charged particle beam current or a specific emission distribution is realized. Accordingly, the apparatuses and methods according to embodiments described herein, may be used not only for reconditioning, cleaning and/or rebuilding of the emitter tip, but may as well be used for conditioning and building of an emitter tip.

According to embodiments described herein, charged particle beam device can include a static voltage supplied for the emitter tip voltage such that the tip voltage is very stable. The stability may be advantageous for increasing the resolution of the charged particle beam device. In order to achieve the stability of the static voltage supply, high RC constants are provided. However high RC constants do not allow providing pulses with a desired rise time. Embodiments described herein, may have rise time of one second or smaller. As an example, the rise time may be 100 ms or even less. According to some embodiments described herein, a static voltage supply for providing the tip voltage during normal operation is provided and an additional voltage supply for providing voltage pulses on top of the static voltage is provided. The additional voltage source can have a maximum output voltage corresponding to a maximum amplitude of the voltage pulses. Further, according to other embodiments, the additional voltage supply can be provided to be adapted for a rise time of one second or smaller. According to some embodiments described herein, the slope of the voltages pulses of the voltage pulse voltage supply can be in the range of at least 2 kV/s, at least 10 kV/s or even at least 20 kV/s.

According to some embodiments, the reduced output voltage of the additional voltage source allows for lowering the RC constants while providing a similar stability. According to yet further embodiments, the additional voltage source can be switched off during normal operation so that it does not influence the voltage stability of the stable voltage supply. Embodiments of charged particle beam device including corresponding voltage supplies are illustrated with respect to FIGS. 5 to 10.

As shown in FIGS. 5 and 6, according to embodiments described herein, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13.

According to some embodiments, the additional voltage source 224 can be provided in a series with the stable voltage source 222. According to one embodiment, as shown in FIG. 5 the additional voltage supply 224 is provided before the stable voltage supply 222. According to another embodiment, as shown in FIG. 6, the additional voltage supply 224 is provided between the stable voltage supply 222 and the emitter unit.

According to further embodiments, which are illustrated with respect to FIG. 7, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. According to some embodiments, the additional voltage source 224 for providing the voltage pulses can be applied to the extraction electrode 212. Thereby, the electric field at the emitter tip can be similarly changed as if the voltage pulse would be applied directly to the emitter tip.

As shown in FIG. 8, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. According to yet further embodiments, which can be combined with other embodiments described above, an additional electrode 812 can be provided in the vicinity of the emitter tip 13. The additional voltage source 224 for applying voltage pulses on top of the stable voltage, which is provided by voltage source 222, is connected to the additional electrode 812. Thereby, the electric field for cleaning or rebuilding of the emitter tip 13 is provided via the additional electrode 812.

Figure 9:
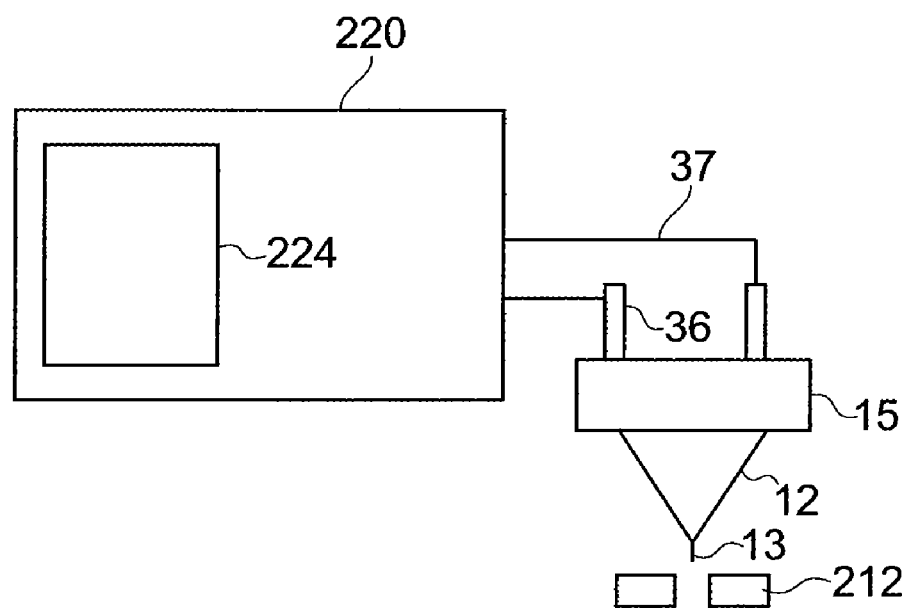
FIG. 9 shows a schematic view of a charged particle beam source and voltage source for a stable voltage and for voltage pulses according to embodiments described herein.

As shown in FIG. 9, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. According to yet further embodiments, as illustrated with respect to FIG. 9, the additional voltage supply 224 may be integrated in the voltage supply 220 for providing the stable voltage for the emitter tip during normal operation.

Figure 10:
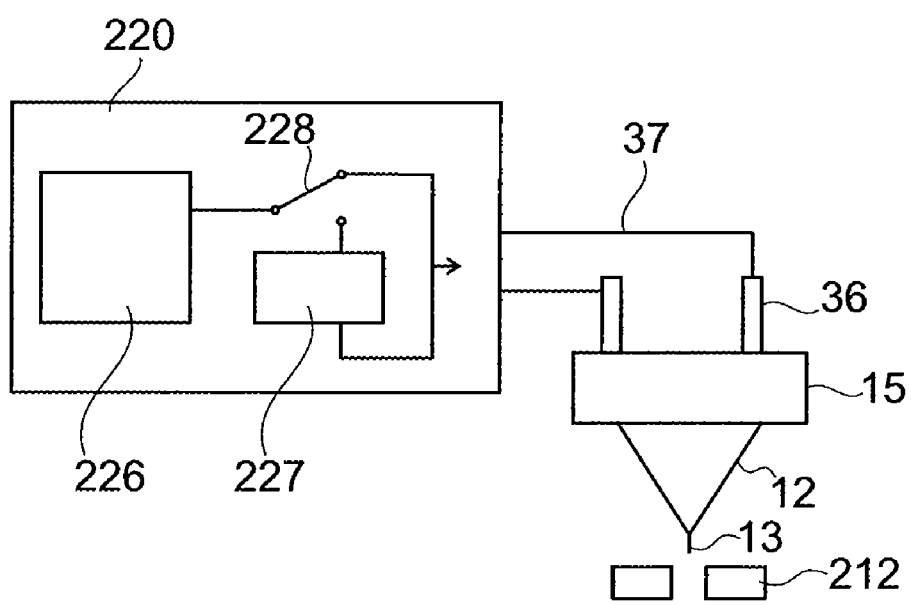
FIG. 10 shows a schematic view of a charged particle beam source and a further voltage source for a stable voltage and for voltage pulses according to embodiments described herein.

As shown in FIG. 10, an emitter unit of the gas field ion source is provided. The emitter unit can include a base 15 with a supporting wire 12 being fixed to the base. As shown in FIG. 2, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. According to yet further embodiments, as illustrated with respect to FIG. 10, a voltage source 220 can be provided. Voltage source 220 can include a portion 226 which provides the desired high voltage and a portion 227 providing the desired RC constants for the stability of the voltage source. The voltage source 220 further includes a switch 228 which can be controlled to either add the high RC constants for providing a very stable high-voltage or the high-voltage can be directly applied to the output of the voltage sources 220. Thereby, voltage source 220 which can be switched between a stable operation mode and the pulse operation mode can be provided. The switch allows shorting the internal stabilizing capacitors so that pulsing with short rise times can be performed.

Figure 11:
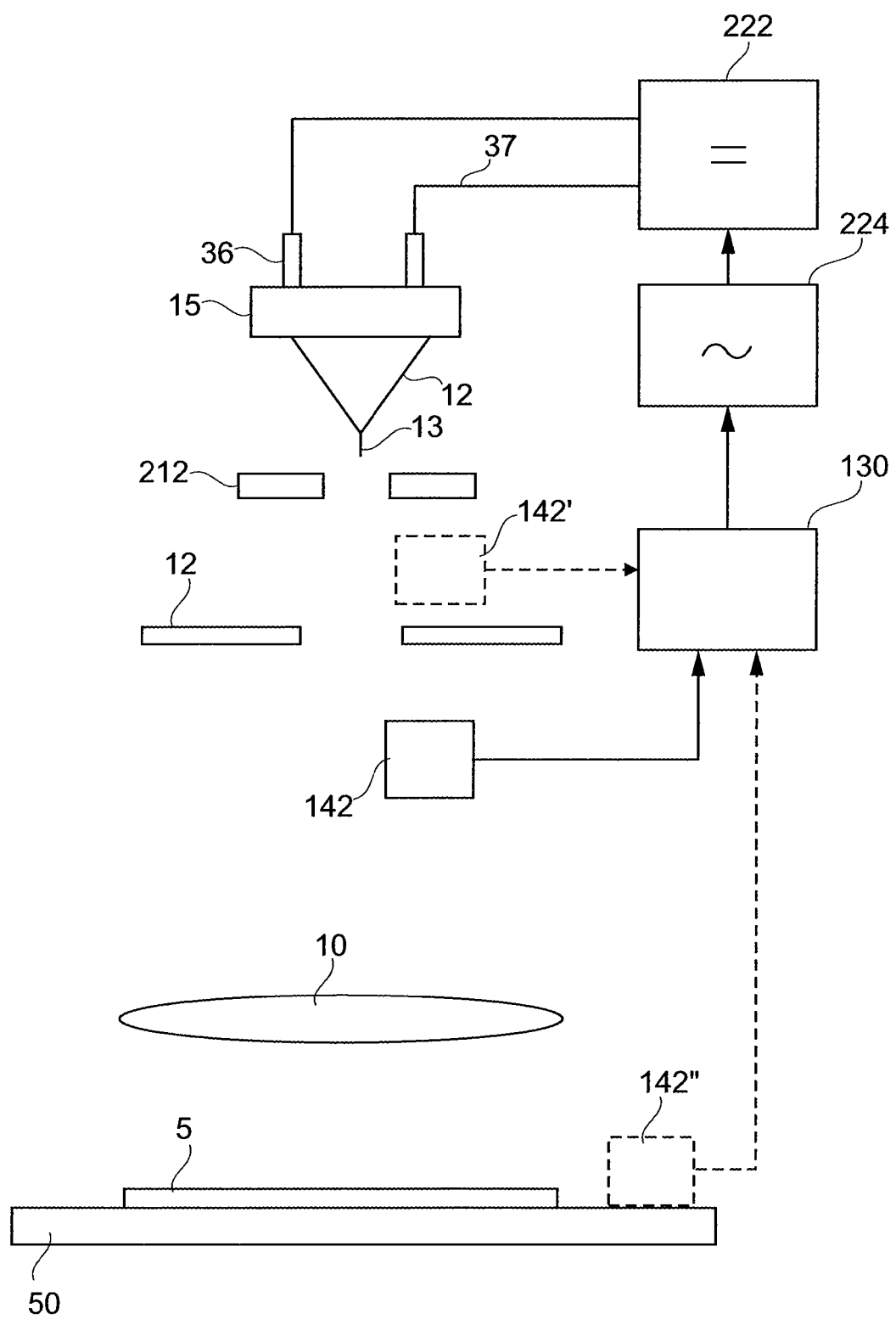
FIG. 11 shows a schematic view of a charged particle beam device including a charged particle beam source and control of a voltage applied to the charged particle beam source according to embodiments described herein.

FIG. 11 shows a charged particle beam device illustrating embodiments of a control of a charged particle beam source. The charged particle beam source has a base 15 with the support wire 12 attached thereto. As shown in FIG. 11, the emitter unit includes an emitter 13, e.g., a sharp single crystal, which is for example made of tungsten, iridium, or the like and which is welded to the supporting wire 12. An extraction electrode 212 is provided, which acts as a counter electrode to the positively biased emitter during operation. The high-voltage, which is supplied during operation, can be provided via wires 37 and connections 36. Thereby, a high-voltage for the gas field ion source can be supplied via the supporting wire 12 to the emitter tip 13. During normal operation, that is, during, e.g., imaging, testing, patterning or specimen modification, a stable high voltage is provided by the voltage source 222. The charged particle beam is guided through the charged particle beam device by elements like an aperture 12 and an objective lens 10. The objective lens 10 focuses the charged particle beam on a specimen 5, which is located on the specimen support 50.

According to further embodiments, additionally a condenser lens, beam scanning deflectors, beam alignment deflectors, a stigmator, a detector or for detecting secondary and/or backscattered charged particles, other detectors, other beam guiding elements or a combination thereof may be provided. According to different embodiments, which can be combined with other embodiments described herein, elements of the charged particle beam device can be electrostatic, magnetic or combined electrostatic magnetic.

FIG. 11 shows a measuring unit 142 for measuring the beam characteristics of the charged particle beam. Within FIG. 11, as an example, the beam characteristic measuring unit is shown as a beam current measuring unit provided between the aperture 12 and the objective lens 10. According to different embodiments, this can be a Faraday cup, an electrode or other elements connected to an electrometer. According to further embodiments, other elements can be used for measuring a charged particle beam current. According to yet further embodiments, measuring units for measuring an emitter distribution, i.e., an angular emission distribution, or the like can be provided.

Accordingly, according to different embodiments, which can be combined with any of the embodiments described herein, a beam current, an emission current, and emission distribution or other beam characteristics can be measured. Thereby, the beam current is to be understood as the charged particle beam current in a column of a charged particle beam device, whereas the emission current is to be understood as the charged particle beam current emitted from the emitter tip, i.e., before blanking or other means influencing the charged particle beam current. Further, any of these characteristics might be measured with regard to their amplitude and/or their stability. Accordingly, for example, an amplitude of the beam current, a stability of the beam current, an amplitude of the emission current, a stability of the emission current, an amplitude or other characteristic of the emission distribution (e.g., number of emitted peaks), a stability of the emission distribution, an amplitude of other beam characteristics, and/or a stability of other beam characteristics can be measured.

According to embodiments described herein, the beam characteristic measuring unit 142 is connected to controller 130. The controller 130 is adapted for evaluating whether or not one or more beam characteristics is at the desire value or within a desire range.

According to some embodiments described herein, the controller 130 is connected to a pulse voltage supply 224. If the evaluation of the measurement of the beam characteristic measuring unit shows the result that the emitter tip 13 of the charged particle beam device is degraded, the controller triggers the pulse voltage supply 224 to apply a voltage pulse or a series of voltage pulses on top of the static high-voltage. Thereby, according to different embodiments, the fixed voltage pulse amplitude or voltage pulse duration can be used or and adapted voltage pulse amplitude or one adapted voltage pulse duration can be used (combination). Due to the fact that voltage pulses are applied, the beam characteristic measuring unit 142 can measure the beam characteristic between the voltage pulses and determining an endpoint for cleaning and/or rebuilding of the emitter tip.

According to further embodiments, as indicated by the beam characteristic measuring units 142' and 142", additionally or alternatively further beam characteristic measuring units can be provided above anode 12 or adjacent to the specimen support 50. Signals provided from these beam characteristic measuring units are also provided to the controller 130 and can be used for similar charged particle beam voltage supply control procedures.

Figure 12:
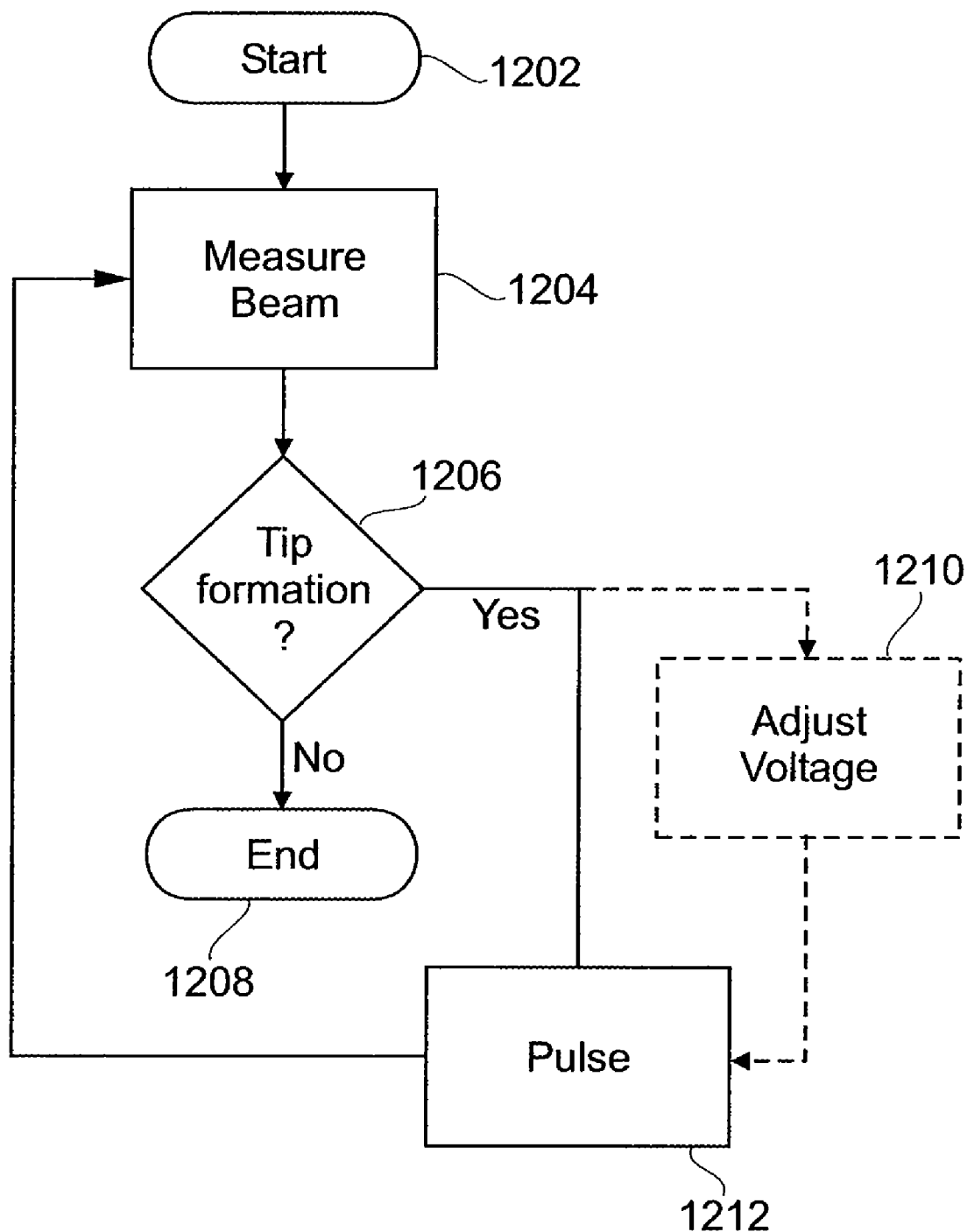
FIG. 12 shows a method for cleaning and/or rebuilding an emitter tip of the charged particle beam source according to embodiments described herein.

FIG. 12 shows a flow chart illustrating one cycle of an emitter tip cleaning and/or rebuilding according to embodiments described herein. The cycle of FIG. 12, which starts with step 1202 and ends with step 1208, can be repeated continuously, for example every 1 min, every 10 min or every 30 min. Typically ranges can, according to other embodiments, also be every 2 min to 1 h or every 5 min to 10 min.

After the start of the cleaning and/or rebuilding method, the beam is measured in step 1204. According to different embodiments, an emitter current, an angular emission distribution or other beam characteristics can be measured. Thereafter, in step 1206 it is evaluated if a tip formation is required or not. If no tip formation is required since, for example, the beam current is at the desire value, the cycle ends in step 1208. As described above, the news cycle can be started every 1 min, every 10 min or every 30 min. Typically ranges can, according to other embodiments, also be every 2 min to 1 h or every 5 min to 10 min.

If the tip formation is required (step 1206: yes), according to one embodiment, a voltage pulse is generated in step 1212. After the voltage pulse, the beam is measured in step 1204 and a further evaluation step follows in step 1206. Thereby, a voltage pulse is provided in step 1212 as long as the emitter tip does not show the desired beam characteristic. According to yet further embodiments, it might also be possible that the beam is measured only every second or every third pulse. This might depend on the voltage pulse amplitude or the voltage pulse duration used for tip formation.

According to an alternative embodiment, as indicated by dotted lines in FIG. 12, the voltage pulse can be adjusted in step 1210. Accordingly, after step 1206, if the tip formation is required, the voltage pulse amplitude, the voltage pulse duration or another voltage pulse characteristic like shape or slope of the voltage pulse is adjusted in 1210 and afterwards the voltage pulse is applied on top of the static voltage in step 1212. Thereby, according to different embodiments, the adjustment of the voltage pulse in step 1210 can be provided based on a fixed pattern or function such as a predetermined increase or decrease of pulse amplitude or pulse duration, or combinations thereof. According to other embodiments, the adjustment of the voltage pulse can be conducted as a function of the measured beam characteristic.

Within FIG. 12 a, one or more voltage pulses are applied in step 1212. In step 1204 the time period at which the pulse is low is used to measure at least one charged particle beam characteristic. According to further embodiments, which can be combined with any of the embodiments described herein, a measurement of one ore more beam characteristic with a measuring unit can also be conducted during a time period when the pulse is high. Thereby, additional information with regard to the tip conditioning or tip reconditioning process can be yielded. Typically, one beam characteristic can be measured within a time period when the voltage pulse is low and another beam characteristic can be measured within a time period when the beam is high. Thereby, for example, each of the characteristics can be selected from the group consisting of: amplitude of the beam current, a stability of the beam current, an amplitude of the emission current, a stability of the emission current, an amplitude or other characteristic of the emission distribution (e.g., number of emitted peaks), a stability of the emission distribution, an amplitude of other beam characteristics, and a stability of other beam characteristics can be measured.

According to yet further embodiments, the beam characteristics to be measured in step 1204 can change during a conditioning or reconditioning process. As an example, if the reconditioning is in a cleaning phase another beam characteristics might be measured as compared to a reconditioning in a rebuilding phase. As another example, one beam characteristic can be measured if there is a larger deviation from the desired emitter tip condition, whereas another beam characteristic can be measured if the emitter condition gets closer to the desired emitter condition. Thereby, e.g., a threshold of one or more beam characteristic values might be defined.

Generally, embodiments described herein may describe for example a charged particle beam device. The charged particle beam device includes an emitter unit including an emitter tip, voltage supply unit adapted for providing a stable voltage to generate a stable extraction field at the emitter tip, a pulsed voltage supply member adapted for providing a pulsed voltage to generate a pulsed extraction field on top of the stable extraction field, a measuring unit for measuring an emitter characteristics, and a control unit adapted for receiving a signal from the measuring unit and for control of the pulsed voltage supply member. Thereby, according to different alternatives or options to be added, the pulsed voltage supply member can be a pulsed voltage supply. The supply may optionally be provided in series to the voltage supply unit. Alternatively, the pulsed voltage supply can be connected to an extraction electrode of the charged particle beam device or to a pulse electrode of the charged particle beam device. As a further alternative, the pulsed voltage supply member can be a pulsed voltage supply provided within the voltage supply unit and/or the pulsed voltage supply member is adapted for switching the voltage supply unit from a stable operation mode to a pulsed operation mode.

According to yet further embodiments, which can be combined with any of the embodiments described herein, the measuring unit includes a beam current measuring system and/or a angular emission distribution measuring system.

According to yet further embodiments, which can be combined with any of the embodiments described herein, the pulsed voltage supply member has a rise time of 0.2 s/kV or less and/or a maximum power output of 5 kV, preferably 3 kV, and more preferably 1 kV According to other embodiments, a method of operating a charged particle beam device having an emitter unit including an emitter tip is provided. The method can include emitting a charged particle beam by providing a static voltage, measuring one or more characteristics of the charged particle beam for providing measurement result, and in dependence of the measurement result, providing a voltage pulse in addition to the static voltage. Additionally, a series of voltage pulses can be provided. According to yet further embodiments, measuring can be repeated between two voltage pulses of the series of voltage pulses for providing at least one further measurement result. Thereby, as a further option the number of voltage pulses in the series of voltage pulses can be adapted based on the at least one further measuring result, the amplitude and/or the time period of individual, some or all voltage pulses in the series of voltage pulses can be adapted based on the at least one further measuring result, the amplitude a first voltage pulse is below 10% of the static voltage, the amplitude of the voltage pulse, of individual, some or all voltage pulses in the series of voltage pulses is below a field evaporation threshold, and/or the amplitude of individual or some voltage pulses in the series of voltage pulses is increased to be above the field evaporation threshold.

According to yet other embodiments, which can be combined with embodiments described herein, the time period of the voltage pulse is 5 s or less and/or the amplitude of the voltage pulse between 5% and 30% of the static voltage.

Embodiments described herein refer to feedback of a measuring signal and voltage pulses applied for conditioning, reconditioning, cleaning, building and/or rebuilding of an emitter tip of a charged particle beam device. Thereby, an improved control of the ending of the conditioning, reconditioning, cleaning, building and/or rebuilding process can be provided. Further, the embodiments described herein allow for automated in situ processes. According to embodiments described herein, automated tip (re-)processing a cleaning procedure can be provided to recover a degraded ideal tip geometry (e.g., a trimer) or a contaminated tip. Additionally, the processes can increase the life-time of the emitter tip because the pulses can prevent the emitter tip from damage in light of exaggerated tip reconditioning.

While the foregoing is directed to embodiments of the invention, other and further embodiments of the invention may be devised without departing from the basic scope thereof, and the scope thereof is determined by the claims that follow.

The invention claimed is:

1. A charged particle beam device, comprising:
   an emitter unit for generating a charged particle beam directed onto a specimen, including an emitter tip;
   a voltage supply unit adapted for providing a stable voltage to generate a stable extraction field at the emitter tip sufficient for emitting a charged particle beam from the emitter tip;
   a pulsed voltage supply member adapted for providing a pulsed voltage to generate a pulsed extraction field on top of the stable extraction field;
   a measuring unit adapted for measuring an emitter characteristic of the charged particle beam before interacting with the specimen and providing a measuring result, wherein the measuring occurs between voltage pulses when the stable extraction field is generated at the emitter tip to emit a charged particle beam from the emitter tip; and
   a control unit adapted for receiving a signal from the measuring unit and for control of the pulsed voltage supply member in dependence on the measuring result.

2. The charged particle beam device according to claim 1, wherein the pulsed voltage supply member is a pulsed voltage supply.

3. The charged particle beam device according to claim 2, wherein the pulsed voltage supply member is provided in series to the voltage supply unit.

4. The charged particle beam device according to claim 2, wherein the pulsed voltage supply member is connected to an extraction electrode of the charged particle beam device.

5. The charged particle beam device according to claim 2, wherein the pulsed voltage supply is connected to an additional electrode of the charged particle beam device.

6. The charged particle beam device according to claim 1, wherein the pulsed voltage supply member is a pulsed voltage supply provided within the voltage supply unit.

7. The charged particle beam device according to claim 1, wherein the pulsed voltage supply member is adapted for switching the voltage supply unit from a stable operation mode to a pulsed operation mode.

8. The charged particle beam device according to claim 1, wherein the measuring unit includes a beam current measuring system.

9. The charged particle beam device according to claim 1, wherein the measuring unit includes an angular emission distribution measuring system.

10. The charged particle beam device according to claim 1, wherein the pulsed voltage supply member has a rise time of 1 s/kV or less.

11. The charged particle beam device according to claim 1, wherein the pulsed voltage supply member has a maximum power output of 5 kV, preferably 3 kV, and more preferably 1 kV.

12. The charged particle beam device according to claim 1, wherein the emitter unit is a gas field ion source.

13. A method of operating a charged particle beam device having an emitter unit including an emitter tip, comprising:
   emitting a charged particle beam by providing a static voltage;
   measuring a characteristic of the charged particle beam before interacting with a specimen for providing measurement result; and
   dependent on the measurement result, providing a voltage pulse in addition to the static voltage.

14. The method of operating a charged particle beam device according to claim 13, wherein a series of voltage pulses is provided.

15. The method of operating a charged particle beam device according to claim 13, wherein measuring is repeated between two voltage pulses of the series of voltage pulses for providing at least one further measurement result.

16. The method of operating a charged particle beam device according to claim 13, wherein the number of voltage pulses in the series of voltage pulses is adapted based on the at least one further measuring result.

17. The method of operating a charged particle beam device according to claim 13, wherein the amplitude and/or the time period of individual, some or all voltage pulses in the series of voltage pulses is adapted based on the at least one further measuring result.

18. The method of operating a charged particle beam device according to claim 13, wherein the amplitude of a first voltage pulse is below 10% of the static voltage.

19. The method of operating a charged particle beam device according to claim 13, wherein the amplitude of the voltage pulse, of individual, some or all voltage pulses in the series of voltage pulses is below a field evaporation threshold.

20. The method of operating a charged particle beam device according to claim 19, wherein the amplitude of individual or some voltage pulses in the series of voltage pulses is increased to be above the field evaporation threshold.

21. The method of operating a charged particle beam device according to claim 13, wherein the time period of the voltage pulse is 5 seconds or less.

22. The method of operating a charged particle beam device according to claim 13, wherein the amplitude of the voltage pulse is between 5% and 30% of the static voltage.

* * * * *